United States Patent [19]

Pitt et al.

[11] Patent Number: 4,712,065
[45] Date of Patent: Dec. 8, 1987

[54] MAGNETIC FIELD SENSORS, IN PARTICULAR OPTICAL FIBER MAGNETOMETERS

[75] Inventors: Gillies D. Pitt, Hewelsfield; Philip Extance, Shirley; Roger E. Jones, Little Shelford, all of England

[73] Assignee: STC plc, London, England

[21] Appl. No.: 831,263

[22] Filed: Feb. 20, 1986

[30] Foreign Application Priority Data

Feb. 23, 1985 [GB] United Kingdom ............... 8504727

[51] Int. Cl.⁴ .................. G01R 33/02; G02B 5/30; G02F 1/29; G02F 1/31
[52] U.S. Cl. ............................ 324/244; 350/375
[58] Field of Search ............ 324/244, 260, 96; 350/374, 375, 378, 392

[56] References Cited

U.S. PATENT DOCUMENTS 4,600,885 7/1986 Koo et al. ............................ 324/244

OTHER PUBLICATIONS

K. P. Koo, A. Dandridge, A. B. Tveten, and G. H. Sigel, Jr., "A Fiber-Optic DC Magnetometer", IEEE Journal of Lightwave Technology, vol. LT-1, No. 3, Sep. 1983, pp. 524–525.

K. P. Koo and G. H. Sigel, Jr., "A Fiber-Optic Magnetic Gradiometer", IEEE Journal of Lightwave Technology, vol. LT-1, No. 3, Sep. 1983, pp. 509–513.

Primary Examiner—Reinhard J. Eisenzopf
Assistant Examiner—Walter E. Snow
Attorney, Agent, or Firm—Kerkam, Stowell, Kondracki & Clarke

[57] ABSTRACT

In a fiber optic interferometric magnetic sensor or magnetic gradient detector a magnetic bias field is applied to a magnetically sensitized portion of an optical fiber by means which are driven by optical power whereby a completely passive sensor head arrangement may be achieved. In a magnetic gradient detector optical power from a high power laser (34) may be supplied via an optical fiber (35) to illuminate a solar cell 27 to whose electrical output terminals solenoids (25,26) are connected. A portion of a respective optical fiber (21, 22) which is magnetically sensitized, by for example bonding to a strip of magnetostrictive material (23, 24), is disposed inside each solenoid (25, 26).

8 Claims, 5 Drawing Figures

MAGNETIC FIELD SENSORS, IN PARTICULAR OPTICAL FIBER MAGNETOMETERS

BACKGROUND OF THE INVENTION

This invention relates to magnetic field detection and in particular to optical fibre magnetometers for determining magnetic fields or magnetic field gradients.

Interferometric fibre optic magnetometers are already known for example from "A fibre-optic dc magnetometer" by K. P. Koo et al. Journal of Lightwave Technology, Vol. LT-1, No. 3, Sept. 1983, p 524-5. They basically comprise an all-fibre Mach-Zehnder interferometer, one arm of which is magnetically sensitised by, for example, being bonded to a strip of magnetostrictive material or coated with a magnetostrictive material. A d.c. magnetic field has the effect of altering the optical path length of the sensitised arm and the interferometer output which is proportional to the differential path length change ($\Delta L$) is thus related to the magnetic field (H), $\Delta L \, \delta H^2$. To overcome inaccuracies due to noise etc an a.c. bias field at frequency w is applied to the sensitised arm and then the interferometer output at frequency w is directly proportional to the d.c. magnetic field.

A fibre-optic magnetic gradient detector is described by K. P. Koo et al in the article on pages 509–513 of the publication referred to above. In this case both arms of the all-fibre Mach-Zehnder interferometer are magnetically sensitised and a.c. bias fields at the same frequency are applied to both sensitised portions. The detector described in this article only measures the magnetic gradient in one direction, that is between the two arms.

In our co-pending G.B. Application No. 8504729 (P. Extance-R. E. Jones 17-17) there is described a fibre optic magnetic gradient detector which detects two orthogonal magnetic gradient components simultaneously and employs three sensitised optical fibre portions, two in one arm and one in the other arm of an all-fibre Mach Zehnder interferometer, and a.c. bias fields at two different frequencies.

SUMMARY OF THE INVENTION

According to one present invention there is provided a magnetic field sensor including a single mode optical fibre, a portion of which is magnetically sensitised, and means for generating a bias magnetic field at said portion, which means is driven by optical power.

According to another aspect of the present invention there is provided an optical fibre interferometric magnetometer comprising a magnetic field sensor including a single mode optical fibre a portion of which is magnetically sensitised and means for generating a bias magnetic field at said portion, which means is driven by optical power.

According to a further aspect of the present invention there is provided an optical fibre interferometric magnetic gradient detector comprising a magnetic field sensor including a single mode optical fibre a portion of which is magnetically sensitised and means for generating a bias magnetic field at said portion, which means is driven by optical power.

BRIEF DESCRIPTION OF THE DRAWINGS

Embodiments of the present invention will now be described with reference to the accompanying drawings, in which.

DESCRIPTION OF THE PREFERRED EMBODIMENTS

Figure 1:
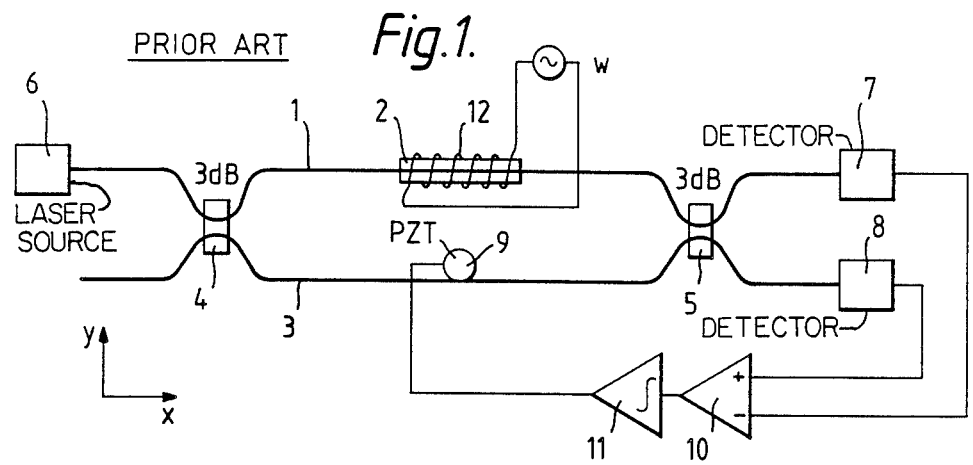
FIG. 1 illustrates schematically, a known optical fibre magnetometer.

The known optical fibre magnetometer (magnetic field sensor) shown in FIG. 1 is an all-fibre Mach-Zehnder interferometer with a single mode fibre arm 1, a portion of which is magnetically sensitised, for example by being bonded to a strip 2 of magnetostrictive material, and a single mode fibre reference arm 3. The input and output ends of the fibre arms are coupled by respective 3dB couplers 4 and 5. A stabilised laser source 6 supplies light into one of the fibres. Detectors 7 and 8 are employed at the output of the interferometer and their outputs are employed to control a PZT phase modulator 9, and hence the operation of the interferometer itself, via a differential amplifier 10 and an integrator 11, as well as to provide an indication of detected d.c. magnetic fields. An a.c. bias field at a frequency w is applied to the sensitised fibre portion, by for example disposing it in a solenoid 12.

If the magnetostrictive element is subject to both a field of interest (d.c. field to be measured) and the a.c. bias field at frequency w, then the non-linear characteristics of the magnetostrictive material will cause mixing of the two signals. Hence the signal at the detector will have a component at frequency w which is proportional to the d.c. field of interest. If a parallel portion of arm 3 is also magnetically sensitised and an a.c. bias field applied thereto by disposing it in a respective solenoid connected in series with solenoid 12, then the sensitised portions will measure the magnetic field $B_x$ along the x direction and since they are spaced apart along the y axis the gradient measured is $(dB_x)/(dy)$ The magnetometer illustrated in FIG. 1, and indeed the gradient magnetometers described in our co-pending GB Application No. 8504729 (P. Extance - R. E. Jones 17-17), use electrical connections to the sensor head (that part of the magnetometer which is directly affected by the field of interest and which may be spaced apart from the electronics for control and other functions) for two purposes. One connection is to the PZT phase modulator used to control the interferometer. This may be eliminated by adopting a passive demodulation scheme for the interferometer such as that referred to in the first mentioned article. The interferometer is then passively stabilised using a (3×3) fibre coupler, for example. The second connection, however, is required to generate the alternating bias field required for the d.c. magnetic field detection scheme. This is rather more difficult to eliminate as if coils are used to generate the fields, currents need to be passed through the coils.

Figure 2:
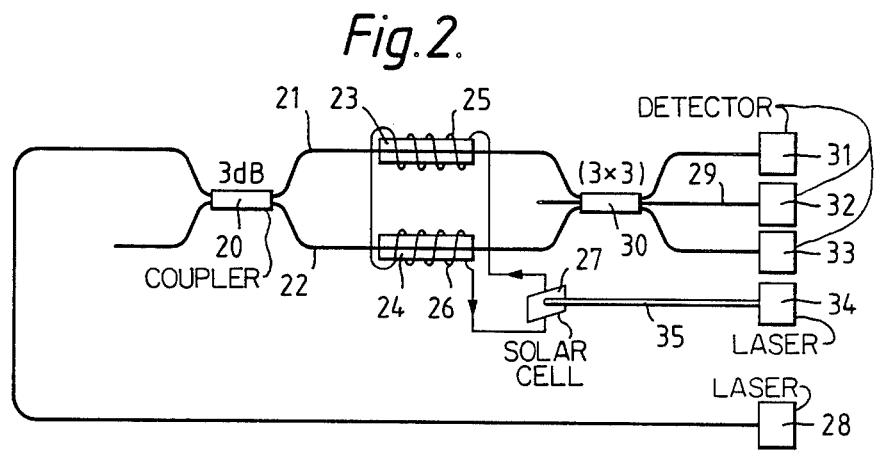
FIG. 2 illustrates schematically an optical fibre magnetic gradient detector with an optically powered magnetic bias field generator according to one embodiment of the present invention and a passive demodulation scheme.
Figure 4:
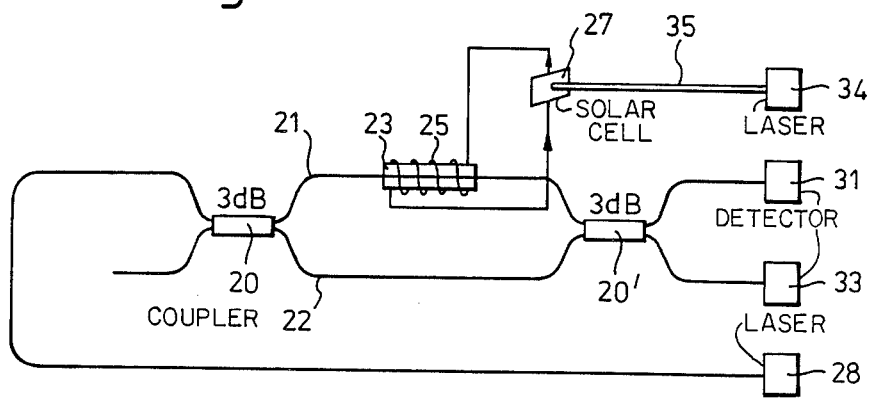
FIG. 4 illustrates schematically an optical fibre magnetic field sensor with the same type of bias field generator as illustrated in FIG. 2.

One possible way of achieving a current in a coil without an electrical connection is illustrated in FIG. 2, which shows a completely passive optical fibre magnetic gradient detector, that is it has no external electrical connections, although a completely passive magnetic field sensor may be designed analogously (FIG. 4). Portions of both arms 21 and 22 of an all-fibre Mach-Zehnder interferometer are magnetically sensitised by for example bonding them to strips of magnetostrictive material 23 and 24 respectively. The sensitised portions are disposed in solenoids 25 and 26 respectively which are coupled in series and across the electrical output terminals of a solar cell 27. The arms 21 and 22 are coupled by a 3dB coupler 20 at the input end of the interferometer, light from a single mode laser 28 driving the interferometer. For passive demodulation the output ends of arms 21 and 22 are coupled to another fibre 29 via a (3×3) coupler 30, a respective detector 31, 32, 33 being associated with each fibre. A high power laser 34 is employed to transmit optical power down an optical fibre 35 to the solar cell 27. The bias current in the solenoids is achieved by photo-voltaic conversion of the light energy sent down fibre 35 in the solar cell. The necessary bias frequency for an a.c. bias field may be transmitted as the repetition rate of optical pulses constituting the light energy sent down the fibre 35. If, however, a d.c. bias field is required then this is not necessary, the energy sent down the fibre in this case merely needs to be in a form suitable to generate the d.c. current required in the coil from the cell. The level of magnetic field required to provide the bias field is in the range 100-200 Am$^{-1}$. This field may be generated by a coil of 500 turns with a resistance of 100 Ω carrying a current of 10mA. This will then require a voltage of 1V and a power input of 10 mW. 10 mW of electrical power at 1V may be obtained from two silicon photovoltaic devices in series, illuminated by 50mW of optical power at a wavelength of 850 nm. This may be readily supplied by a high power diode laser of a type readily available from the suppliers e.g. Spectra Diode Laboratories. The field sensor of FIG. 4 has only one arm 21 magnetically sensitised and thus only a 3dB coupler 20' is required at the output end of arms 21 and 22. The same reference numerals are used in FIGS. 2 and 4 for similar elements.

Figure 3:
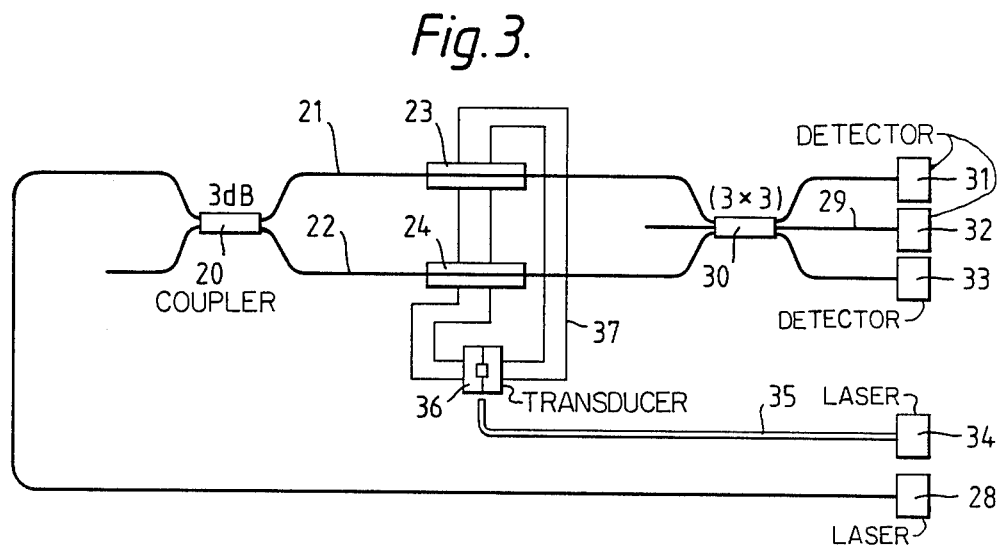
FIG. 3 illustrates, schematically an optical fibre magnetic gradient detector with an alternative optically powered magnetic bias field generator to that of FIG. 2.

FIG. 3 illustrates an alternative approach. Once again a (3×3) coupler passive demodulation scheme is employed and the same reference numerals are used for similar elements to those of FIG. 2. In this case, however, optical power supplied by a high power laser 34 is sent down fibre 35 to thermally excite a resonant silicon transducer 36 incorporating a small permanent magnet. The permanent magnet is caused to oscillate and this provides the required a.c. bias field. The field may be routed to the sensitised fibre portions by means of high permeability cores of, for example, metallic glass or Mumetal as indicated by 37.

Such a resonant silicon transducer comprises a thin silicon vibrating element with a small permanent magnet attached to it and it is set in motion by the optical power falling on it.

Examples of optically driven mechanical vibrators are described in our co-pending G.B. Application No 85 00148 (A.E. Brewster 92), although the present case is not to be considered as restricted thereto. The silicon transducer technique may also be employed analogously with a magnetic field sensor rather than the magnetic gradient detector specifically described.

Figure 5:
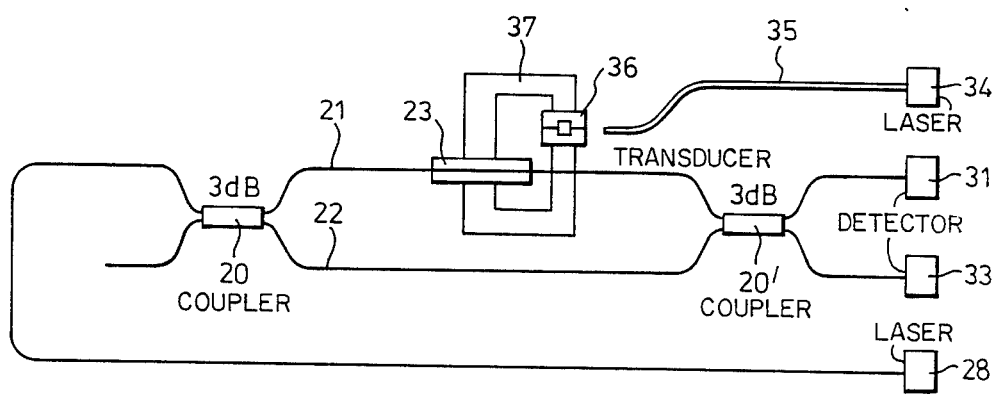
FIG. 5 illustrates schematically an optical fibre magnetic field sensor with the same type of bias field generator as illustrated in FIG. 3.

FIG. 5 illustrates a magnetic field sensor using a similar optical power supply to that illustrated in FIG. 3. Only arm 21 is magnetically sensitised and thus only a 3dB coupler 20' is required at the output end of arms 21 and 22. The same reference numerals are used in FIGS. 3 and 5 for similar elements.

We claim:

1. A magnetic field sensor including a signal mode optical fiber, a portion of which is magnetically sensitised by being associated with magnetostrictive material, and means for generating a bias magnetic field at said portion, which means is optically powered.

2. A magnetic field sensor as claimed in claim 1, wherein said bias magnetic field generating means includes a solar cell, a respective optical fiber for supplying optical power from a high power laser source to illuminate the solar cell and a solenoid in which the magnetically sensitised optical fiber portion is located, the solenoid being connected across the electrical output terminals of the solar cell.

3. A magnetic field sensor as claimed in claim 2, wherein said bias magnetic field generating means serves to provide an a.c. bias magnetic field whose bias frequency is transmitted as the repetition rate of optical pulses transmitted down the high power laser optical fiber.

4. A magnetic field sensor as claimed in claim 1, wherein said bias magnetic field generating means includes a resonant silicon transducer comprising a thin silicon vibratable element to which is attached a permanent magnet, a magnetic circuit in which are disposed the transducer and the magnetiacally sensitised fiber portion, a high power laser source, and a respective optical fiber for supplying optical power from the high power laser source to the transducer, the optical power from the high power lasser source serving to thermally excite the vibratable element and cause it to vibrate and oscillate the permanent magnet, thus providing an a.c. magnetic field which is routed to the magnetically sensitised fiber portion via the magnetic circuit.

5. An optical fiber interfrometric magnetometer comprising a magnetic field sensor including a single mode optical fibre a portion of which is magnetically sensitised by being associated with magnetostrictive material, and means for generating a bias magnetic field at said portion, which means is optically powered.

6. An optical fiber interferometric magnetometer as claimed in claim 5 and including means for passively demodulating the interferometer.

7. An optical fiber interferometric magnetic gradient detector comprising a magnetic field sensor including a single mode optical fibre, a portion of which is magnetically sensitised by being associated with magetostrictive material, and means for generating a bias magnetic field at said portion, which means is optically powered.

8. An optical fiber interferometric magnetic gradient detector as claimed in claim 7 and including means for passively demodulating the interferometer.

* * * * *